US010243404B2

(12) United States Patent
Inoue et al.

(10) Patent No.: US 10,243,404 B2
(45) Date of Patent: Mar. 26, 2019

(54) WIRELESS POWER RECEIVING APPARATUS

(71) Applicant: ROHM CO., LTD., Ukyo-Ku, Kyoto (JP)

(72) Inventors: Naoki Inoue, Kyoto (JP); Daisuke Uchimoto, Kyoto (JP); Kazuyoshi Yasuoka, Kyoto (JP)

(73) Assignee: ROHM CO. LTD., Kyoto (JP)

( * ) Notice: Subject to any disclaimer, the term of this patent is extended or adjusted under 35 U.S.C. 154(b) by 343 days.

(21) Appl. No.: 15/141,008

(22) Filed: Apr. 28, 2016

(65) Prior Publication Data
US 2016/0285313 A1  Sep. 29, 2016

Related U.S. Application Data

(63) Continuation of application No. PCT/JP2014/075290, filed on Sep. 24, 2014.

(30) Foreign Application Priority Data

Oct. 30, 2013  (JP) .................. 2013-225932
Oct. 30, 2013  (JP) .................. 2013-225933

(51) Int. Cl.
H02J 50/12       (2016.01)
H02J 50/80       (2016.01)
(Continued)

(52) U.S. Cl.
CPC .............. H02J 50/12 (2016.02); G01R 21/06 (2013.01); H02J 5/005 (2013.01); H02J 7/025 (2013.01);
(Continued)

(58) Field of Classification Search
CPC .. H02J 50/12; H02J 50/80; H02J 50/10; H02J 7/025; G01R 21/06; G01R 31/40
(Continued)

(56) References Cited

U.S. PATENT DOCUMENTS

2016/0036243 A1* 2/2016 Hayashi .............. B60L 11/1829
                                                    307/104
2016/0241083 A1* 8/2016 He ......................... H02J 50/80
(Continued)

FOREIGN PATENT DOCUMENTS

JP  2006184063 A  7/2006
JP  2011022022 A  2/2011
(Continued)

OTHER PUBLICATIONS

SIPO First Office Action corresponding to Application No. 201480056331.5; dated Jun. 1, 2018.
(Continued)

Primary Examiner — Thomas Skibinski
(74) Attorney, Agent, or Firm — Cantor Colburn LLP

(57) ABSTRACT

A power receiving apparatus is configured including a control circuit together with a reception coil, a rectifier circuit, a smoothing capacitor, and a modulator. A received power calculation unit calculates an electric power consumption $P_D$ of the wireless power receiving apparatus based on a predetermined calculation expression. A parameter acquisition unit acquires a first parameter $\alpha$ and a second parameter $\beta$ via an external component. A correction unit calculates a received electric power $P_{RP}$ of the wireless power receiving apparatus according to a correction expression $P_{RP} = \alpha \times P_D + \beta$.

16 Claims, 8 Drawing Sheets

(51) Int. Cl.
*H02J 5/00* (2016.01)
*G01R 21/06* (2006.01)
*H02J 50/10* (2016.01)
*H02J 7/02* (2016.01)
*H02J 50/60* (2016.01)
*G01R 31/40* (2014.01)

(52) U.S. Cl.
CPC .............. *H02J 50/10* (2016.02); *H02J 50/60* (2016.02); *H02J 50/80* (2016.02); *G01R 31/40* (2013.01)

(58) Field of Classification Search
USPC ................................... 307/104; 320/107–115
See application file for complete search history.

(56) References Cited

U.S. PATENT DOCUMENTS

2017/0025895 A1* 1/2017 Hayashida ............. H02J 7/025
2017/0346344 A1* 11/2017 Uchimoto ............... H02J 50/80

FOREIGN PATENT DOCUMENTS

| JP | 2011086174 A | 4/2011 |
| JP | 2012083263 A | 4/2012 |
| JP | 2013132170 A | 7/2013 |

OTHER PUBLICATIONS

Notification of Reasons for Refusal for corresponding JP Application No. 2015-544869; dated Apr. 24, 2018.

* cited by examiner

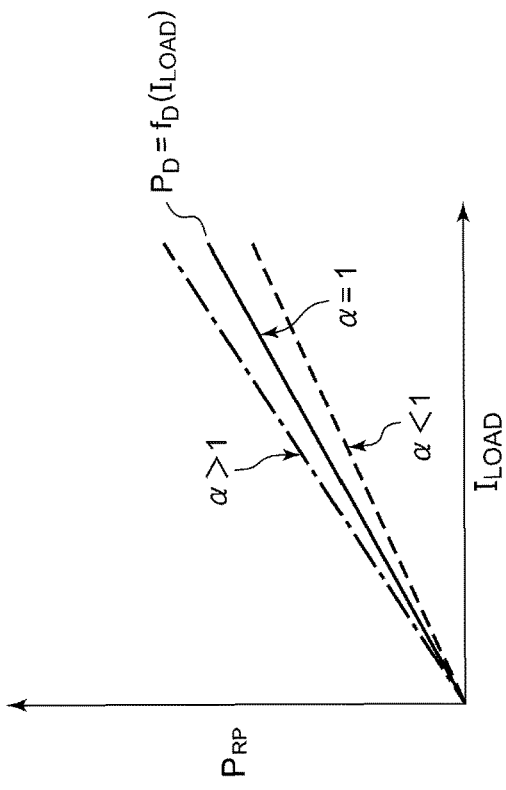
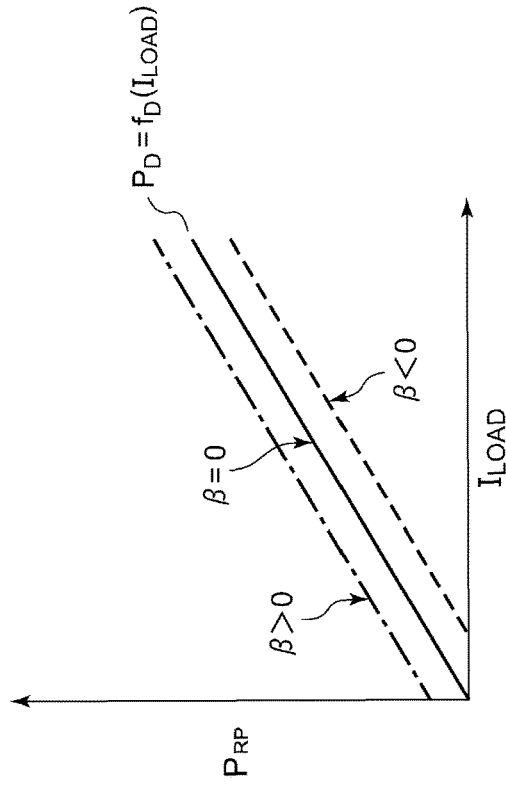
FIG.4A
FIG.4B

WIRELESS POWER RECEIVING APPARATUS

CROSS-REFERENCE TO RELATED APPLICATIONS

This application is a continuation under 35 U.S.C. § 120 of PCT/JP2014/075290, filed Sep. 24, 2014, which is incorporated herein reference and which claimed priority to Japanese Application No. 2013-225932, filed Oct. 30, 2013 and Japanese Application No. 2013-225933, filed Oct. 30, 2013. The present application likewise claims priority under 35 U.S.C. § 119 to Japanese Application No. 2013-225932, filed Oct. 30, 2013 and Japanese Application No. 2013-225933, filed Oct. 30, 2013, the entire content of which is also incorporated herein by reference.

BACKGROUND OF THE INVENTION

1. Field of the Invention

The present invention relates to a wireless power supply technique.

2. Description of the Related Art

In recent years, in order to supply electric power to an electronic device, contactless power transmission (which is also referred to as "contactless power supply" or "wireless power supply") has begun to come into commonplace use. In order to advance the compatibility of products between manufacturers, the WPC (Wireless Power Consortium) has been organized, and the WPC has developed the Qi standard as an international standard.

The wireless power supply that conforms to the Qi standard uses electromagnetic induction between a transmission coil and a reception coil. A power supply system is configured including a power supply apparatus having a power transmission coil and a power receiver terminal having a reception coil.

FIG. 1 is a diagram showing a configuration of a wireless power supply system 100 that conforms to the Qi standard. The power supply system 100 includes a power transmission apparatus 200 (TX: power transmitter) and a power receiving apparatus 300 (RX: power receiver). The power receiving apparatus 300 is mounted on an electronic device, examples of which include cellular phone terminals, smartphones, audio players, game machines, and tablet terminals.

The power transmission apparatus 200 includes a transmission coil (primary coil) 202, a driver 204, a controller 206, and a demodulator 208. The driver 204 includes an H-bridge circuit (full-bridge circuit) or otherwise a half-bridge circuit. The driver 204 applies a driving signal S1, specifically, in the form of a pulse signal, to the transmission coil 202. This provides a driving current flowing through the transmission coil 202, which generates an electric power signal S2 at the transmission coil 202 in the form of an electromagnetic signal. The controller 206 integrally controls the overall operation of the power transmission apparatus 200. Specifically, the controller 206 controls the switching frequency of the driver 204 or otherwise the duty ratio of the switching of the driver 204 so as to adjust the electric power to be transmitted.

In the Qi standard, a protocol is defined for communication between the power transmission apparatus 200 and the power receiving apparatus 300, which enables information transmission from the power receiving apparatus 300 to the power transmission apparatus 200 via a control signal S3. The control signal S3 is transmitted from a reception coil 302 (secondary coil) to the transmission coil 202 in the form of an AM (Amplitude Modulation) modulated signal using backscatter modulation. The control signal S3 includes electric power control data (which will also be referred to as a "packet") which indicates an amount of electric power to be supplied to the power receiving apparatus 300, and data which indicates the particular information for identifying the power receiving apparatus 300. The demodulator 208 demodulates the control signal S3 included in the current or otherwise the voltage applied to the transmission coil 202. The controller 206 controls the driver 204 based on the power control data included in the control signal S3 thus demodulated.

The power receiving apparatus 300 includes the reception coil 302, a rectifier circuit 304, a smoothing capacitor 306, a modulator 308, a load 310, a controller 312, and a power supply circuit 314. The reception coil 302 receives the electric power signal S2 from the transmission coil 202, and transmits the control signal S3 to the transmission coil 202. The rectifier circuit 304 and the smoothing capacitor 306 rectify and smooth a current S4 induced at the reception coil 302 according to the electric power signal S2, thereby converting the current S4 into a DC voltage.

Using electric power supplied from the power transmission apparatus 200, the power supply circuit 314 charges an unshown secondary battery or steps up or otherwise steps down the DC voltage $V_{RECT}$, so as to supply the DC voltage to the controller 312 or other circuits such as the load 310.

The controller 312 monitors the amount of electric power supplied to the load 310, and accordingly generates electric power control data which indicates the amount of electric power to be transmitted from the power transmission apparatus 200. The modulator 308 modulates the control signal S3 including the electric power control data so as to modulate the coil current that flows through the reception coil 302, thereby modulating the coil current and coil voltage applied to the transmission coil 202.

With the power supply system 100, the power transmission apparatus 200 and a power receiver terminal (electronic device) are located within a space with a relatively high degree of freedom. Thus, it is conceivable that a state can occur in which there is a foreign object such as a piece of metal or the like between, or otherwise in the vicinity of, the transmission coil and the reception coil. In a case in which there is such a foreign object, this reduces the degree of coupling between the transmission coil 202 and the reception coil 302, leading to a problem of reduced power supply efficiency. Also, this leads to a problem of the foreign object heating up.

In order to solve such a problem, foreign object detection (FOD) has been defined in the Qi standard. As a method for the FOD, a method has been proposed in which the transmitted electric power and the received electric power are each measured, and detection is made based on the comparison result with respect to the presence or absence of a foreign object.

In the first stage, the present inventors investigated an approach in which electric power consumed by the internal components of the power receiving apparatus 300, i.e., specifically, the sum total of electric power consumed by the power supply circuit 314, the load 310, the control circuit 400, and the like, is used as the received electric power in the FOD method.

However, in some cases, the electric power consumed by the internal components of the power receiving apparatus 300 does not necessarily match the electric power received by the power receiving apparatus 300.

This means that all the electric power received by the power receiving apparatus 300 is not necessarily consumed by the internal components of the power receiving apparatus 300. In other words, this means that a part of the electric power supplied to the power receiving apparatus 300 is absorbed before it reaches the reception coil 302. Alternatively, this means that a part of the electric power supplied to the power receiving apparatus 300 is consumed by circuits other than the power supply circuit 314, the load 310, and the control circuit 400. As a result of further investigation, the present inventors have recognized that electric power reception is affected by the structure, configuration, and layout of the reception coil 302 employed in the power receiving apparatus 300, and the structure and material of a housing of the electronic device.

It should be noted that the knowledge described above is by no means within the scope of common and general knowledge of those skilled in this art. That is to say, the knowledge described above has been uniquely recognized by the present inventors.

SUMMARY OF THE INVENTION

The present invention has been made in order to solve such a problem. Accordingly, it is an exemplary purpose of an embodiment of the present invention to provide a control circuit for a power receiving apparatus which is capable of calculating the received electric power with high precision.

1. An embodiment of the present invention relates to a control circuit for a wireless power receiving apparatus. The control circuit comprises: a received power calculation unit that calculates an electric power consumption $P_D$ of the wireless power receiving apparatus based on a predetermined calculation expression; a parameter acquisition unit that acquires a first parameter $\alpha$ and a second parameter $\beta$ via an external component; and a correction unit that calculates a received electric power $P_{RP}$ of the wireless power receiving apparatus according to a correction expression $P_{RP}=\alpha \times P_D+\beta$.

With such an embodiment, the two kinds of correction parameters $\alpha$ and $\beta$ are optimized based on the form, structure, and layout of the reception coil, and the form, material, and the like of a housing of an electronic device mounting the wireless power receiving apparatus. Thus, such an arrangement is capable of detecting the received electric power of the wireless power receiving apparatus with high precision. This allows a foreign object to be detected with improved precision.

Also, the parameter acquisition unit may be coupled to multiple resistors each configured as an external resistor. Also, the parameter acquisition unit may be configured to acquire the first parameter $\alpha$ and the second parameter $\beta$ according to resistance values of the multiple resistors thus connected.

Also, the parameter acquisition unit may comprise: a voltage converter unit that converts the resistance values of the multiple resistors into multiple voltages; and an A/D converter that converts the multiple voltages into respective multiple digital values. Also, the parameter acquisition unit may acquire the multiple digital values as the first parameter $\alpha$ and the second parameter $\beta$.

Also, the multiple resistors may be connected in series so as to form a resistor string. Also, the voltage converter unit may comprise: multiple setting terminals connected to terminals of the multiple resistors; and a current source that supplies a constant current to the resistor string. Also, the A/D converter may convert, into a digital value, voltages at the multiple setting terminals and/or a voltage difference between the multiple setting terminals.

Also, the parameter acquisition unit may comprise: multiple setting terminals connected to the multiple resistors; multiple current converter units each of which is provided to a corresponding one of the multiple resistors, and each of which generates a current that is inversely proportional to a resistance value of the corresponding resistor; and multiple voltage converter units each of which is provided to a corresponding one of the multiple current converter units, and each of which converts the current generated by the corresponding current converter unit into a voltage.

Also, the parameter acquisition unit may comprise: an interface circuit that receives, from an external processor, serial data including the first parameter $\alpha$ and the second parameter $\beta$; and a register that stores the first parameter $\alpha$ and the second parameter $\beta$.

Also, the received power calculation unit may comprise a load current measurement unit that measures a current $I_{LOAD}$ that flows through a load of the wireless power receiving apparatus. Also, the received power calculation unit may calculate the electric power consumption $P_D$ based on a predetermined function $f_D(I_{LOAD})$.

Also, in addition to the control circuit, the wireless power receiving apparatus may further comprise: a reception coil; a rectifier circuit that rectifies a current that flows through the reception coil; and a smoothing capacitor that is connected to an output of the rectifier circuit, so as to generate a rectified voltage $V_{RECT}$. Also, the function $f_D(I_{LOAD})$ may include a term represented by $(V_{RECT} \times I_{LOAD})$.

Also, the function $f_D(I_{LOAD})$ may further include a term $(R_{ON} \times I_{LOAD}^2)$ with $R_{ON}$ as a predetermined constant.

Also, the control circuit may comprise: a power supply current measurement unit that measures an operation current $I_{DD}$ that flows through the control circuit itself; and a voltage measurement unit that measures a power supply voltage $V_{DD}$ supplied to the control circuit. Also, the function $f_D(I_{LOAD})$ may further include a term $(V_{DD} \times I_{DD})$.

Also, the control circuit may operate using the rectified voltage $V_{RECT}$ as the power supply voltage $V_{DD}$.

Also, the control circuit may conform to the Qi standard.

Also, the control circuit may be monolithically integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By monolithically integrating the circuit as a single IC (integrated circuit), such an arrangement allows the circuit area to be reduced, and allows the circuit elements to have uniform characteristics.

Another embodiment of the present invention relates to a wireless power receiving apparatus. The wireless power receiving apparatus comprises: a reception coil; a rectifier circuit that rectifies a current that flows through the reception coil; a smoothing capacitor that is connected to an output of the rectifier circuit, so as to generate a rectified voltage $V_{RECT}$; and any one of the aforementioned control circuits.

2. An embodiment of the present invention relates to a control circuit for a wireless power receiving apparatus. The control circuit comprises: a current detection unit that detects a current I that flows through a predetermined path; a received power calculation unit that calculates an electric power consumption $P_D$ of the wireless power receiving apparatus based on a predetermined function $f_D(I)$ with the current I as an argument; a parameter acquisition unit that acquires parameters $\alpha_1$ through $\alpha_N$ to be respectively set for N (N represents an integer of 2 or more) segments obtained by dividing a range of the current I into N segments; and a correction unit that corrects the electric power consumption $P_D$ calculated by the received power calculation unit using the parameter $\alpha_i$ when the current I is included in the i-th segment.

With such an embodiment, the current I is divided into multiple segments. Furthermore, the parameters to be set for the respective segments are optimized based on the form, structure, and layout of the reception coil, and the form, material, and the like of a housing of an electronic device mounting the wireless power receiving apparatus. Thus, such an arrangement is capable of detecting the received electric power of the wireless power receiving apparatus with high precision. This allows a foreign object to be detected with improved precision.

With an embodiment, the j-th parameter $\alpha_j$ may be used to correct a slope of the received electric power $P_{RPj}$ for the current I for the j-th segment.

With such an embodiment, the slope of the received electric power $P_{RPj}$ with respect to the current I can be adjusted for each segment. Thus, such an arrangement provides high-precision fitting between the calculated value of the received electric power and the actual received electric power.

Also, with a threshold that determines a boundary between the i-th segment and the (i+1)-th segment as $I_i$, the correction unit may calculate the received electric power $P_{RPi}$ for the j-th segment according to correction expressions that include: $P_{RP1}=\alpha_1 \times f_D(I)$; $P_{RP2}=\alpha_2 \times f_D(I-I_1)+\alpha_1 \times f_D(I_1)$; $P_{RP3}=f_D(I-I_2)+\alpha_2 \times f_D(I-I_1)+\alpha_1 \times f_D(I_1)$; and the like.

Such an arrangement allows the received electric power $P_{RP}$ to be calculated such that it is continuous at each boundary between adjacent segments.

Also, in addition to the parameters $\alpha_1$ through $\alpha_N$, the parameter acquisition unit may be configured to acquire a parameter $\beta$ via an external component. Also, the correction unit may add the parameter $\beta$ to the received electric power $P_{RP}$.

Thus, such an arrangement provides high-precision fitting between the calculated value of the received electric power and the actual received electric power.

Also, with a threshold that determines a boundary between the i-th segment and the (i+1)-th segment as $I_i$, the parameter acquisition unit may be further configured to acquire, via an external component, parameters that indicate threshold values $I_1$ through $I_{N-1}$.

Such an embodiment allows the multiple segments to each have a range that is settable based on the form, structure, and layout of the reception coil, and the form, material, and the like of a housing of an electronic device mounting the wireless power receiving apparatus. Thus, such an arrangement is capable of calculating the received electric power with high precision.

Also, the parameter acquisition unit may comprise: an interface circuit that receives, via an external processor, serial data including an external parameter; and a register that stores the parameter thus received.

Also, the parameter acquisition unit may be coupled to multiple resistors as external components. Also, the parameter acquisition unit may be configured to acquire the parameters according to resistance values of the respective multiple resistors thus connected.

Also, the received power calculation unit may comprise a load current measurement unit that measures a current $I_{LOAD}$ that flows through a load of the wireless power receiving apparatus. Also, the received power calculation unit may calculate the electric power consumption $P_D$ based on a predetermined function $f_D(I_{LOAD})$.

Also, the current detection unit may be configured to measure a current $I_{LOAD}$ that flows through a load of the wireless power receiving apparatus. Also, the function $f_D(I)$ is defined with the current $I_{LOAD}$ as an argument.

Also, the control circuit may conform to the Qi standard.

Also, the control circuit may be monolithically integrated on a single semiconductor substrate.

Examples of such a "monolithically integrated" arrangement include: an arrangement in which all the circuit components are formed on a semiconductor substrate; and an arrangement in which principal circuit components are monolithically integrated. Also, a part of the circuit components such as resistors and capacitors may be arranged in the form of components external to such a semiconductor substrate in order to adjust the circuit constants. By monolithically integrating the circuit as a single IC (integrated circuit), such an arrangement allows the circuit area to be reduced, and allows the circuit elements to have uniform characteristics.

Another embodiment of the present invention relates to a wireless power receiving apparatus. The wireless power receiving apparatus comprises: a reception coil; a rectifier circuit that rectifies a current that flows through the reception coil; a smoothing capacitor that is connected to an output of the rectifier circuit, so as to generate a rectified voltage $V_{RECT}$; and any one of the aforementioned control circuits.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which:

FIGS. 4A and 4B are diagrams each showing the received electric power $P_{RP}$ in the power receiving apparatus according to the first embodiment;

DETAILED DESCRIPTION OF THE INVENTION

The invention will now be described based on preferred embodiments which do not intend to limit the scope of the present invention but exemplify the invention. All of the features and the combinations thereof described in the embodiment are not necessarily essential to the invention.

In the present specification, the state represented by the phrase "the member A is connected to the member B" includes a state in which the member A is indirectly connected to the member B via another member that does not substantially affect the electric connection therebetween, or that does not damage the functions or effects of the connection therebetween, in addition to a state in which the member A is physically and directly connected to the member B.

Similarly, the state represented by the phrase "the member C is provided between the member A and the member B" includes a state in which the member A is indirectly connected to the member C, or the member B is indirectly connected to the member C via another member that does not substantially affect the electric connection therebetween, or that does not damage the functions or effects of the connection therebetween, in addition to a state in which the member A is directly connected to the member C, or the member B is directly connected to the member C.

First Embodiment

Figure 2:
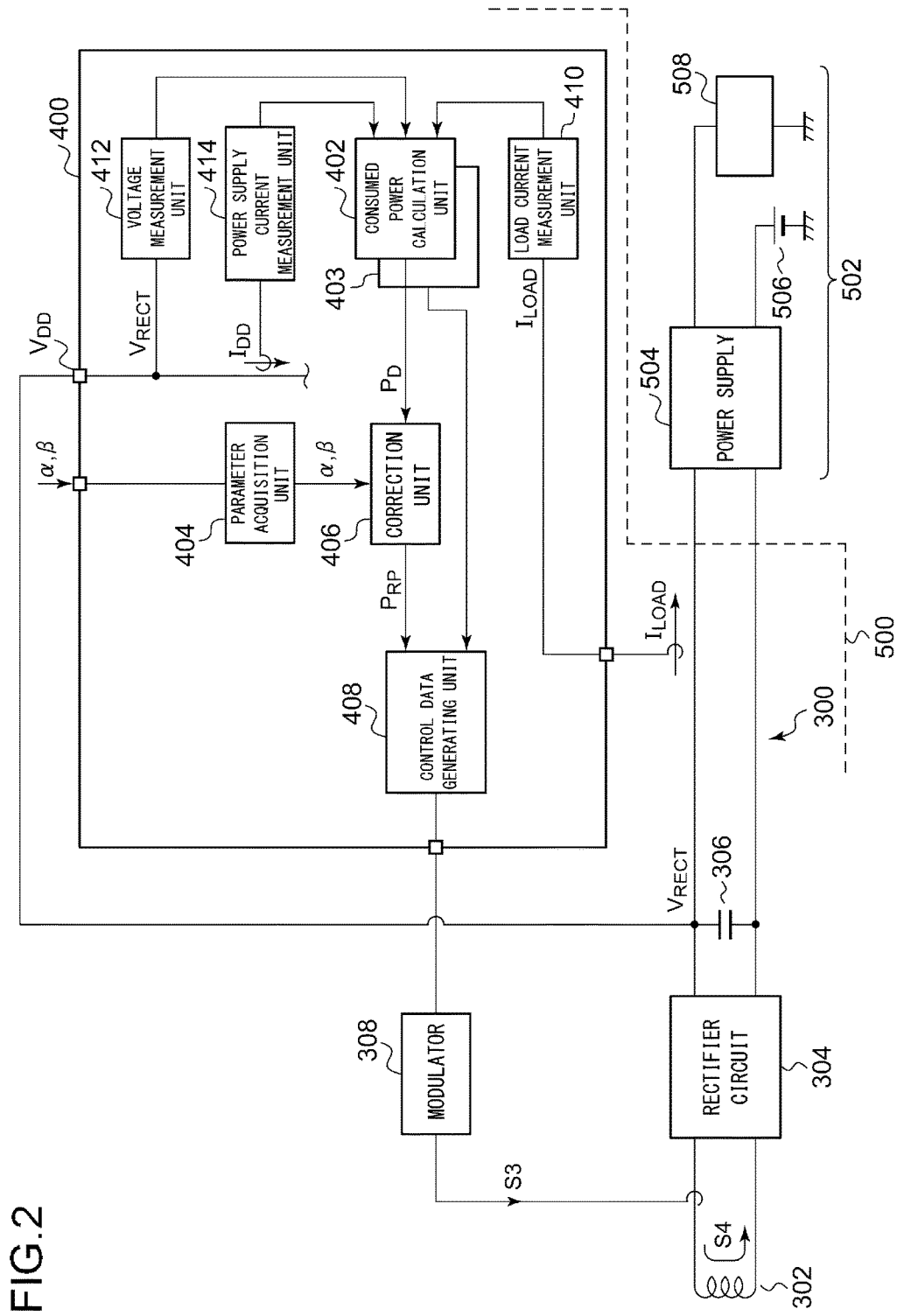
FIG. 2 is a block diagram showing an electronic device including a power receiving apparatus according to a first embodiment.

FIG. 2 is a block diagram showing an electronic device 500 including a power receiving apparatus 300 according to a first embodiment. The power receiving apparatus 300 receives an electric power signal S2 from a power transmission apparatus 200, stores the energy of the electric power signal S2 in a smoothing capacitor 306, and supplies the energy thus stored to a load 502. The load 502 includes a power supply circuit 504, a secondary battery 506, and a processor 508 configured as any one of various kinds of processors.

Figure 1:
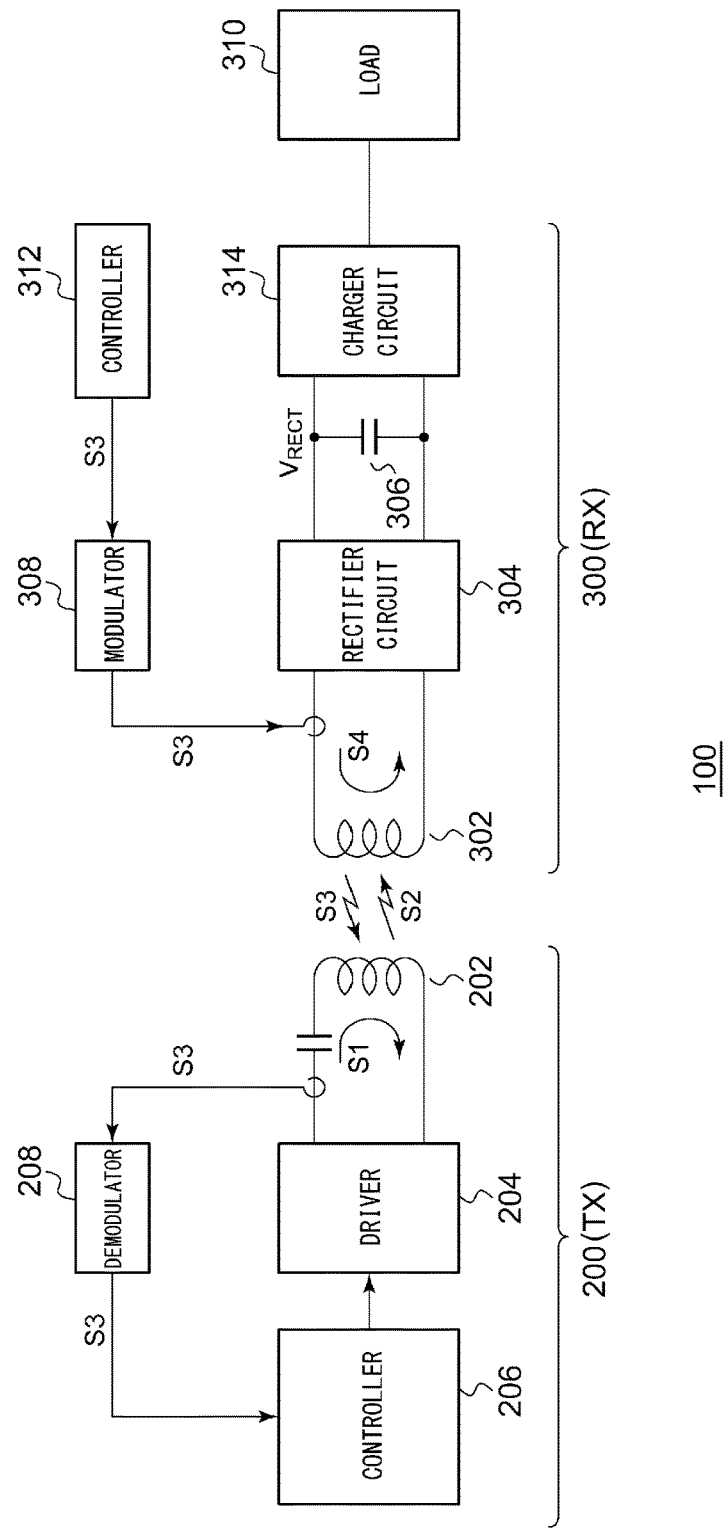
FIG. 1 is a diagram showing a configuration of a wireless power supply system that conforms to the Qi standard.

The power receiving apparatus 300 includes a reception coil 302, the smoothing capacitor 306, a modulator 308, and a control circuit 400. The power receiving apparatus 300 shown in FIG. 2 is used in a power supply system 100 that conforms to the Qi standard shown in FIG. 1.

The reception coil 302 receives the electric power signal S2 from the transmission coil 202. Furthermore, the reception coil 302 transmits a control signal S3 to the transmission coil 202. The rectifier circuit 304 and the smoothing capacitor 306 rectify and smooth a current S4 induced at the reception coil 302 according to the electric power signal S2, so as to convert the electric power signal S2 into a DC voltage $V_{RECT}$.

The power supply circuit 504 includes a charger circuit that charges the secondary battery 506 using electric power supplied from the power transmission apparatus 200, and/or a DC/DC converter that steps up or otherwise steps down the DC voltage $V_{RECT}$ and that supplies the DC voltage $V_{RECT}$ thus stepped up or stepped down to the processor 508.

The control circuit 400 includes a received power calculation unit 402, a parameter acquisition unit 404, a correction unit 406, a control data generating unit 408, a load current measurement unit 410, a voltage measurement unit 412, and a power supply current measurement unit 414, which are monolithically integrated on a single semiconductor substrate.

The received power calculation unit 402 calculates an electric power consumption $P_D$ of the wireless power receiving apparatus 300 based on a predetermined calculation expression.

The parameter acquisition unit 404 acquires a first parameter α and a second parameter β via a component external to the control circuit 400.

The correction unit 406 corrects the electric power consumption $P_D$ calculated by the received power calculation unit 402 according to the following correction expression, so as to calculate received electric power $P_{RP}$ received by the wireless power receiving apparatus 300.

$$P_{RD} = \alpha \times P_D + \beta$$

The control data generating unit 408 generates, based on the received electric power $P_{RD}$ calculated by the correction unit 406, control data DRP which represents the received electric power received by the power receiving apparatus 300. The control data thus generated is transmitted to the power transmission apparatus 200 via the modulator 308 and the reception coil 302. The power transmission apparatus 200 detects a foreign object based on the control data DRP.

The received power calculation unit 403 calculates the electric power supplied from the smoothing capacitor 306 to the load 502. The control data generating unit 408 generates power control data DPC based on the received electric power calculated by the received power calculation unit 403. The power control data DPC is transmitted to the power transmission apparatus 200 via the modulator 308 and the reception coil 302. The power transmission apparatus 200 controls the electric power to be transmitted, based on the power control data DPC.

Next, detailed description will be made regarding the electric power consumption calculation by the received power calculation unit 402.

The load current measurement unit 410, the voltage measurement unit 412, and the power supply current measurement unit 414 each measure a voltage or otherwise a current required to calculate the electric power consumption $P_D$.

The load current measurement unit 410 measures a current $I_{LOAD}$ that flows through the wireless power receiving apparatus 300. The load current $I_{LOAD}$ may be a current that flows from the smoothing capacitor 306 to the load 502.

The received power calculation unit 402 may calculate the electric power consumption $P_D$ based on a predetermined function $f_D(I_{LOAD})$ with at least one argument, i.e., the load current $I_{LOAD}$.

The DC voltage $V_{RECT}$ is supplied to a power supply terminal $V_{DD}$ of the control circuit 400. The voltage measurement unit 412 measures the DC voltage $V_{RECT}$ that occurs across the smoothing capacitor 306.

The power supply current measurement unit 414 measures a power supply current $I_{DD}$ that flows through the power supply terminal $V_{DD}$ of the control circuit 400.

The received power calculation unit 402 calculates the electric power consumption $P_D$ according to the following function $f_D(I_{LOAD})$.

$$P_D = f_D(I_{LOAD}) = V_{RECT} \times I_{LOAD} + R_{ON} \times I_{LOAD}^2 + V_{DD} \times I_{DD}$$

The first term on the right-hand side $V_{RECT} \times I_{LOAD}$ represents the electric power consumed by the load 502.

The second term on the right-hand side $R_{ON} \times I_{LOAD}^2$ represents the power loss. Here, $R_{ON}$ represents a predetermined constant having an impedance dimension.

The third term on the right-hand side represents the electric power consumption of the control circuit 400. In the present embodiment, the DC voltage $V_{RECT}$ is supplied to the power supply terminal $V_{DD}$ of the control circuit 400. That is to say, the control circuit 400 operates using the rectified voltage $V_{RECT}$ as the power supply voltage. In this case, the relation $V_{DD} = V_{RECT}$ holds true.

Next, description will be made regarding the setting of the parameters α and β for the parameter acquisition unit 404.

Figure 3:
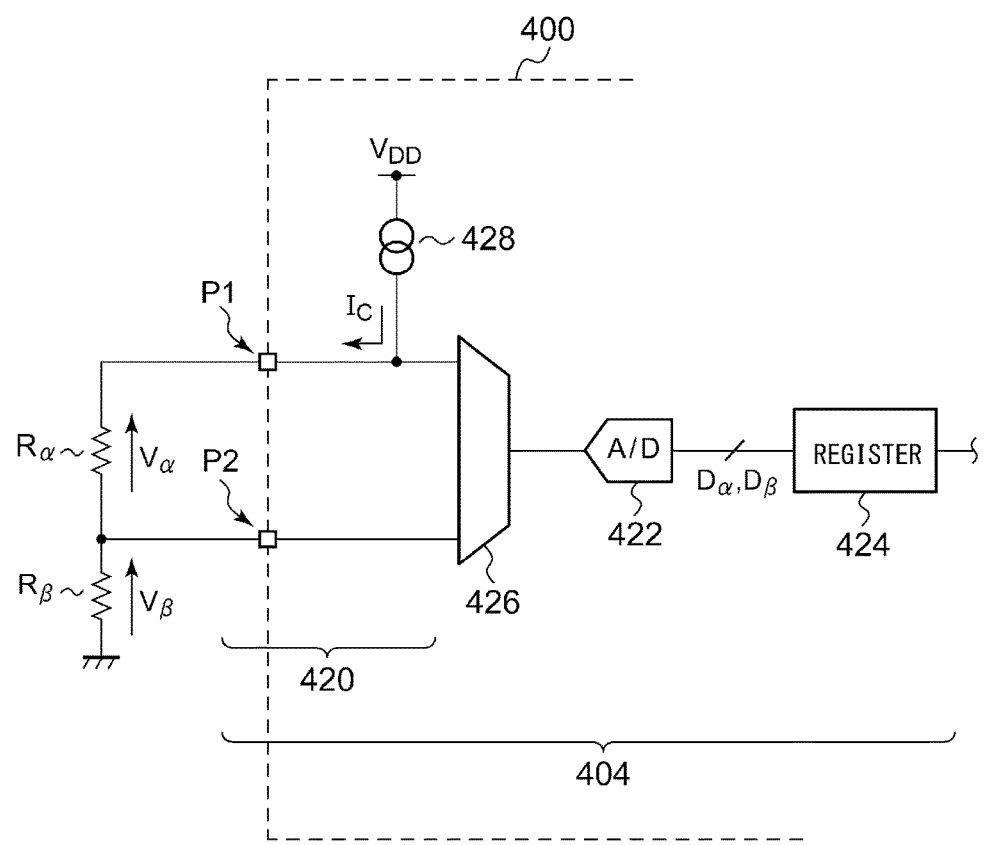
FIG. 3 is a circuit diagram showing an example configuration of a parameter acquisition unit.

FIG. 3 is a circuit diagram showing an example configuration of the parameter acquisition unit 404.

The parameter acquisition unit 404 is coupled to multiple external resistors $R_\alpha$ and $R_\beta$. The parameter acquisition unit 404 is configured to acquire the first parameter α and the second parameter β based on the resistance values of the multiple resistors $R_\alpha$ and $R_\beta$, respectively.

The parameter acquisition unit 404 includes a voltage converter unit 420 and an A/D converter 422. The voltage converter unit 420 converts the resistance values of the multiple resistors $R_\alpha$ and $R_\beta$ into multiple voltages $V_\alpha$ and $V_\beta$, respectively. The A/D converter 422 converts the multiple voltages $V_\alpha$ and $V_\beta$ into multiple digital values $D_\alpha$ and $D_\beta$, respectively. A selector 426 may be provided as a stage preceding the A/D converter 422. With such an arrangement, the A/D converter 422 configured as a single A/D converter may convert the multiple voltages $V_\alpha$ and $V_\beta$ into the digital values $D_\alpha$ and $D_\beta$, respectively, in a time sharing manner. The digital values $D_\alpha$ and $D_\beta$ are stored in a register 424 as the first parameter α and the second parameter β, respectively.

The voltage converter unit 420 includes multiple setting terminals P1 through P2 and a current source 428. The multiple resistors $R_\alpha$ and $R_\beta$ are connected in series between the setting terminal P1 and an external ground terminal so as to form a resistor string. The multiple setting terminals P1 and P2 are connected to the terminals of the respective multiple resistors $R_\alpha$ and $R_\beta$ (respective taps of the resistor string). The current source 428 is connected to the setting terminal P1, so as to supply a predetermined constant current Ic to the resistor string formed of $R_\alpha$ and $R_\beta$.

The A/D converter 422 may convert, into a digital value, the voltage at each setting terminal, or at least one voltage difference between the setting terminals.

A voltage drop $V_\alpha$, which is represented by ($R_\alpha \times Ic$), occurs across both ends of the resistor $R_\alpha$. On the other hand, a voltage drop $V_\beta$, which is represented by ($R_\beta \times Ic$), occurs across both ends of the resistor $R_\beta$. The A/D converter 422 converts each of the voltage drop $V_\alpha$, which is a voltage difference between the setting terminals P1 and P2, and the voltage drop $V_\beta$, which is an electric potential at the setting terminal P2, into a corresponding digital value.

The above is the configuration of the power receiving apparatus 300.

Next, description will be made regarding the operation of the power receiving apparatus 300. FIGS. 4A and 4B are diagrams each showing the received electric power $P_{RP}$ received by the power receiving apparatus 300. The horizontal axis represents the load current $I_{LOAD}$, and the vertical axis represents the received electric power $P_{RP}$. It should be noted that the received electric power $P_{RP}$ represented by the aforementioned function $f_D$ includes a nonlinear term. However, in this example, for simplicity of description and ease of understanding, the received electric power $P_{RP}$ is represented by a linear function.

By changing the second parameter β, as shown in FIG. 4A, such an arrangement is capable of correcting, in the intercept direction, the received electric power $P_{RP}$ calculated based on the predetermined function $f_D(I_{LOAD})$. Furthermore, by changing first parameter α, as shown in FIG. 4B, such an arrangement is capable of correcting the slope of the predetermined function $f_D(I_{LOAD})$.

In the design stage for the control circuit 400, the form and structure of the reception coil to be employed together with the control circuit 400 are unknown. Furthermore, the form, material, and the like of the housing of the electronic device, which is to mount the power receiving apparatus 300, are unknown. This means that the predetermined calculation expression is determined without consideration of the reception coil and the housing. However, as described above, the reception coil and the housing have an effect on the electric power received by the power receiving apparatus 300.

With the control circuit 400 according to the present embodiment, the parameters α and β are optimized so as to provide the correct received electric power in a state in which the power receiving apparatus 300 is mounted on the electronic device. Such an arrangement allows the received electric power $P_{RP}$ received by the wireless power receiving apparatus 300 to be detected with high precision. Furthermore, by transmitting the received electric power $P_{RP}$ thus obtained by means of the correction processing to the power transmission apparatus 200, and by comparing the received electric power $P_{RP}$ with the transmitted electric power PTP transmitted by the power transmission apparatus 200, such an arrangement provides higher-precision abnormal object detection.

With the present embodiment, the parameter acquisition unit 404 is provided with parameter instructions for the parameters α and β in the form of the external resistors. Thus, by changing the resistance values of the resistors $R_\alpha$ and $R_\beta$, this allows the designer of the electronic device to change the parameters α and β in a simple manner.

Description has been made above regarding an embodiment of the present invention with reference to the first embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

First Modification

The configuration of the parameter acquisition unit 404 is not restricted to such an arrangement shown in FIG. 3.

Figure 5:
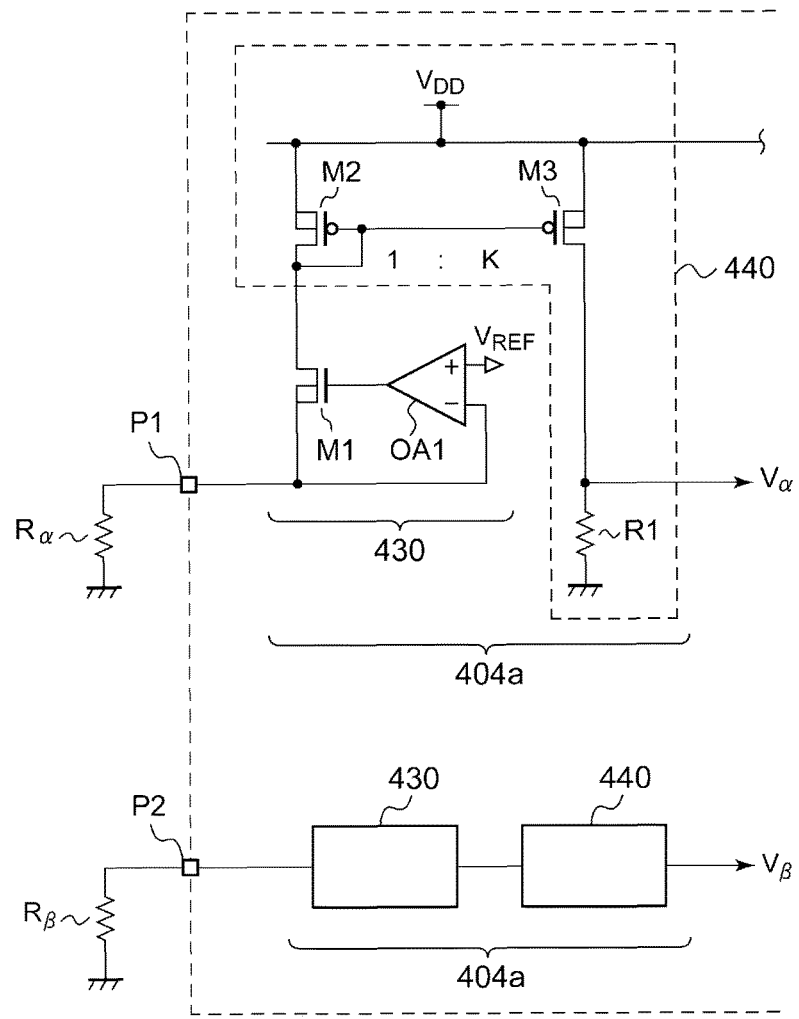
FIG. 5 is a circuit diagram showing another example configuration of a parameter acquisition unit.
Figure 6:
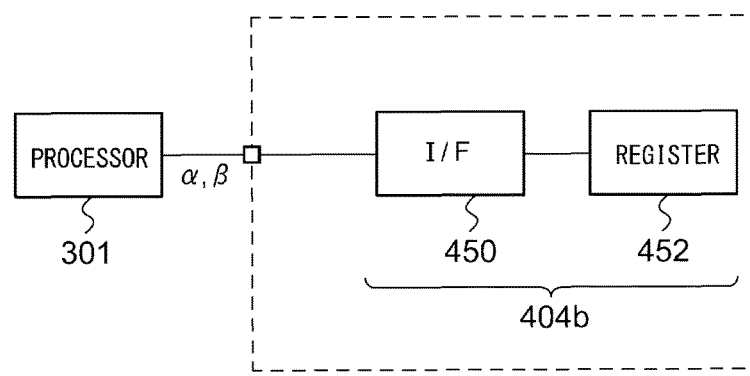
FIG. 6 is a circuit diagram showing another example configuration of a parameter acquisition unit.

FIGS. 5 and 6 are circuit diagrams each showing another example configuration of the parameter acquisition unit 404. A parameter acquisition unit 404a shown in FIG. 5 is provided to each of the resistors $R_\alpha$ and $R_\beta$. The resistor $R_\alpha$ is connected between the setting terminal P1 and the ground terminal. Furthermore, the resistor $R_\beta$ is connected between the setting terminal P2 and the ground terminal.

The parameter acquisition units 404a include multiple current converter units 430 and multiple voltage converter units 440.

The multiple current converter units 430 and the multiple voltage converter units 440 are provided to the respective multiple setting terminals P1 and P2. The current converter unit 430 generates a current $I_\alpha$ that is inversely proportional to the resistance value of the resistor $R_\alpha$ connected to the corresponding setting terminal P1. The voltage converter unit 440 converts the current $I_\alpha$ generated by the corresponding current converter unit 430 into a voltage $V_\alpha$ that is proportional to the current $I_\alpha$.

For example, the current converter unit 430 includes a transistor M1 and an operational amplifier OA1. The current $I_\alpha$, which is represented by $I_\alpha = V_{REF}/R_\alpha$, flows through the transistor M1 and the resistor $R_\alpha$. On the other hand, the voltage converter unit 440 includes a resistor R1 and a current mirror circuit comprising transistors M2 and M3. The voltage converter unit 440 converts the current $I_\alpha$ into a voltage $V_\alpha$ represented by $V_\alpha = K \times R1 \times I_\alpha$. Here, K represents the mirror ratio of the current mirror circuit. The same can be said of the setting terminal P2. The voltages $V_\alpha$ and $V_\beta$ are supplied to an unshown A/D converter, and are converted into digital values $\alpha$ and $\beta$, respectively.

Such a configuration allows the parameters $\alpha$ and $\beta$ to be set according to the resistance values of the external resistors.

A parameter acquisition unit 404b shown in FIG. 6 may include an interface circuit 450 that receives serial data including the first parameter $\alpha$ and the second parameter $\beta$ from an external processor 301, and a register 452 that stores the first parameter $\alpha$ and the second parameter $\beta$.

Alternatively, the parameter acquisition unit 404 may include nonvolatile memory. With such an arrangement, in the design stage for such an electronic device, such parameters may be written to the nonvolatile memory.

Second Modification

Description has been made in the embodiment regarding an arrangement in which the received electric power $P_{RP}$ is calculated according to the following Expression.

$$P_D = f_D(I_{LOAD}) = V_{RECT} \times I_{LOAD} + R_{ON} \times I_{LOAD}^2 + V_{DD} \times I_{DD}$$

However, the present invention is not restricted to such an arrangement.

In a case in which the electric power consumption of the control circuit 400 is negligible, the term $V_{DD} \times I_{DD}$ may be omitted. Also, in a case in which the thermal loss is negligible, the term $R_{ON} \times I_{LOAD}^2$ may be omitted.

Alternatively, the received power calculation unit 402 may employ another function with a value that differs from the load current $I_{LOAD}$ as an argument.

Third Modification

Description has been made in the embodiment regarding a wireless power transmission apparatus that conforms to the Qi standard. However, the present invention is not restricted to such an arrangement. Also, the present invention is applicable to the power receiving apparatus 300 which is to be employed in a system that is similar to the Qi standard. Also, the present invention is applicable to the power receiving apparatus 300 that conforms to other standards which will be developed in the future.

Fourth Modification

A part of the modulator 308 or the power supply circuit 504 may be further integrated on the IC on which the control circuit 400 is integrated.

Second Embodiment

The power receiving apparatus 300 and the control circuit 400 according to the second embodiment have the same basic configurations as those according to the first embodiment shown in FIG. 2. Description will be made regarding only the points of difference.

The load current measurement unit 410 detects a current I that flows through a predetermined path. The received power calculation unit 402 calculates the electric power consumption $P_D$ of the wireless power receiving apparatus 300 based on a predetermined function $f_D(I)$ with the current I as an argument.

The range of the current I is divided into N (N represents an integer of 2 or more) segments. The parameter acquisition unit 404 acquires, via an external component, parameters (which will be referred to as the "first parameters" hereafter) $\alpha_1$ through $\alpha_N$ specified for the respective segments thus divided.

When the current I is included in the i-th segment, the correction unit 406 uses the first parameter $\alpha_i$ to correct the electric power consumption $P_D$ calculated by the received power calculation unit 402, so as to calculate the received electric power $P_{RP}$ of the wireless power receiving apparatus 300.

The j-th parameter $\alpha_j$ is used to correct the received electric power $P_{RPj}$ for the current I in the j-th segment.

More specifically, with the threshold value that determines a boundary between the j-th segment and the (j+1)-th segment as $I_j$, the correction unit 406 calculates the corrected value of the electric power consumption $P_{RPi}$ in the j-th segment according to the following calculation expressions.

$$P_{RP1} = \alpha_1 \times f_D(I)$$

$$P_{RP2} = \alpha_2 \times f_D(I - I_1) + \alpha_1 \times f_D(I_1)$$

$$P_{RP3} = \alpha_3 \times f_D(I - I_2) + \alpha_2 \times f_D(I_2 - I_1) + \alpha_1 \times f_D(I_1)$$

...

As a generalized calculation expression, the following calculation expression can be derived.

$$P_{RPj} = \alpha_j \times f_D(I - I_{j-1}) + P_{RPj-1}(I - I_{j-1})$$

Here, the relations $I_{RP0} = 0$ and $I_0 = 0$ hold true.

In addition to the multiple parameters $\alpha_1$ through $\alpha_N$, the parameter acquisition unit 404 is configured to acquire a parameter (which will also be referred to as the "second parameter") $\beta$ via an external component.

The correction unit 48 adds the parameter $\beta$ to the received electric power $P_{RP}$.

The control data generating unit 408 generates, based on the received electric power $P_{RP}$ calculated by the correction unit 406, control data DRP which represents the received electric power received by the power receiving apparatus 300. The control data thus generated is transmitted to the power transmission apparatus 200 via the modulator 308 and the reception coil 302. The power transmission apparatus 200 detects a foreign object based on the control data DRP.

The received power calculation unit 403 calculates the electric power supplied from the smoothing capacitor 306 to the load 502. The control data generating unit 408 generates power control data DPC based on the received electric power calculated by the received power calculation unit 403. The power control data DPC is transmitted to the power transmission apparatus 200 via the modulator 308 and the reception coil 302. The power transmission apparatus 200 controls the electric power to be transmitted, based on the power control data DPC.

Next, detailed description will be made regarding the calculation of the electric power consumption by the received power calculation unit 402.

The load current measurement unit 410, the voltage measurement unit 412, and the power supply current measurement unit 414 each measure a voltage or otherwise a current required to calculate the electric power consumption $P_D$.

The load current measurement unit 410 measures a current $I_{LOAD}$ that flows through a predetermined path included in the wireless power receiving apparatus 300. The load current $I_{LOAD}$ may be a current that flows from the smoothing capacitor 306 to the load 502.

The DC voltage $V_{RECT}$ is supplied to a power supply terminal $V_{DD}$ of the control circuit 400. The voltage measurement unit 412 measures the DC voltage $V_{RECT}$ that occurs across the smoothing capacitor 306.

The power supply current measurement unit 414 measures a power supply current $I_{DD}$ that flows through the power supply terminal $V_{DD}$ of the control circuit 400.

The received power calculation unit 402 calculates the electric power consumption $P_D$ according to the following function $f_D(I_{LOAD})$.

$$P_D = f_D(I_{LOAD}) = V_{RECT} \times I_{LOAD} + R_{ON} \times I_{LOAD}^2 + V_{DD} \times I_{DD}$$

The first term on the right-hand side $V_{RECT} \times I_{LOAD}$ represents the electric power consumed by the load 502.

The second term on the right-hand side $R_{ON} \times I_{LOAD}^2$ represents the power loss. Here, $R_{ON}$ represents a predetermined constant having an impedance dimension.

The third term on the right-hand side represents the electric power consumption of the control circuit 400. In the present embodiment, the DC voltage $V_{RECT}$ is supplied to the power supply terminal $V_{DD}$ of the control circuit 400. That is to say, the control circuit 400 operates using the rectified voltage $V_{RECT}$ as the power supply voltage. In this case, the relation $V_{DD} = V_{RECT}$ holds true.

Next, description will be made regarding the setting of the parameters $\alpha$ and $\beta$ for the parameter acquisition unit 404. FIG. 6 shows an example configuration of a parameter acquisition unit 404b. The parameter acquisition unit 404b shown in FIG. 6 includes an interface circuit 450 and a register 452. The interface circuit 450 receives, from the external processor 301, serial data including the first parameters $\alpha_1$ through $\alpha_N$ and the second parameter $\beta$. The register 452 stores the first parameters $\alpha_1$ through $\alpha_N$ and the second parameter $\beta$.

Alternatively, the parameter acquisition unit 404 may include nonvolatile memory. With such an arrangement, in the design stage for such an electronic device, such parameters may be written to the nonvolatile memory.

Figure 7A:
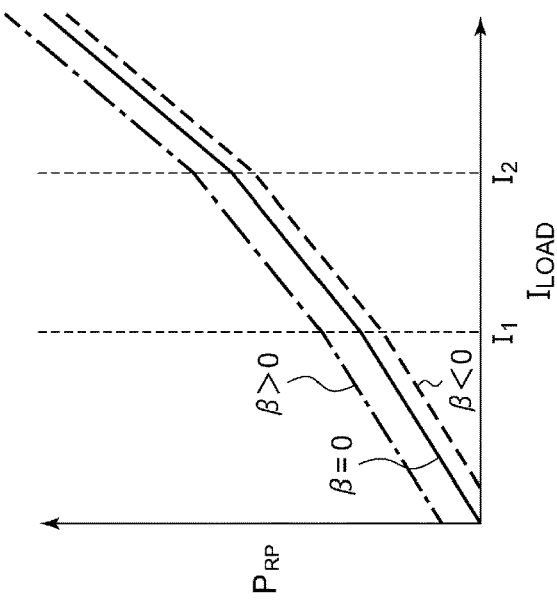
FIGS. 7A and 7B are circuit diagrams each showing a power receiving apparatus according to a second embodiment.
Figure 7B:
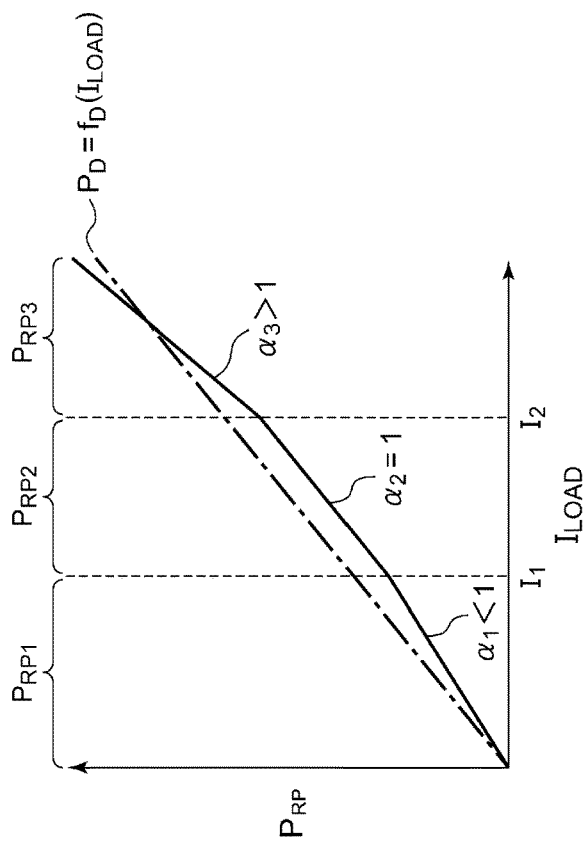

The above is the configuration of the power receiving apparatus 300. Next, description will be made regarding the operation of the power receiving apparatus 300. FIGS. 7A and 7B are diagrams each showing the received electric power $P_{RP}$ received by the power receiving apparatus 300. The horizontal axis represents the load current $I_{LOAD}$, and the vertical axis represents the received electric power $P_{RP}$. It should be noted that the received electric power $P_{RP}$ represented by the aforementioned function $f_D$ includes a nonlinear term. However, in this example, for simplicity of description and ease of understanding, the received electric power $P_{RP}$ is represented by a linear function.

In the present embodiment, the current $I_{LOAD}$ is divided into three segments. Such an arrangement is capable of correcting the received electric power $P_{RP}$ according to the three parameters $\alpha_1$ through $\alpha_3$.

The received electric power $P_{RP}$ shown in FIGS. 7A and 7B satisfies the following Expression.

$$P_{RP} = \alpha \times f_D(I - I_{j-1}) + P_{RPj-1}(I_{j-1}) + \beta$$

Here, the relations $I_{RP0} = 0$ and $I_0 = 0$ hold true.

In a case in which the slope of the received electric power $P_{RP}$ for the current $I_{LOAD}$ is to be set to a value that is smaller than that of the function $f_D(I_{LOAD})$, as shown for the first segment ($0 < I_{LOAD} < I_1$) in FIG. 7A, the first parameter $\alpha_1$ may preferably be set such that the relation $\alpha_1 < 1$ holds true.

Also, in a case in which the slope of the received electric power $P_{RP}$ for the current $I_{LOAD}$ is to be set to a value that is greater than that of the function $f_D(I_{LOAD})$, as shown for the third segment ($I_2 < I_{LOAD}$) in FIG. 7A, the first parameter $\alpha_3$ may preferably be set such that the relation $\alpha_3 > 1$ holds true.

Also, in a case in which the slope of the received electric power $P_{RP}$ for the current $I_{LOAD}$ is to be set to a value that is equal to that of the function $f_D(I_{LOAD})$, as shown for the second segment ($I_1 < I_{LOAD} < I_2$) in FIG. 7A, the first parameter $\alpha_2$ may preferably be set to 1.

Also, by changing the second parameter $\beta$, as shown in FIG. 7B, such an arrangement is capable of correcting, in the intercept direction, the received electric power $P_{RP}$ calculated based on the predetermined function $f_D(I_{LOAD})$ and the parameters $\alpha_1$ through $\alpha_N$.

In the design stage for the control circuit 400, the form and structure of the reception coil to be employed together with the control circuit 400 are unknown. Furthermore, the form, material, and the like of the housing of the electronic device, which is to mount the power receiving apparatus 300, are unknown. This means that the predetermined calculation expression $f_D(I_{LOAD})$ is determined without consideration of the reception coil and the housing. However, as described above, the reception coil and the housing have an effect on the electric power received by the power receiving apparatus 300.

According to the results of investigation by the present inventors, the degree of the effects on the received electric power due to the form, structure, and layout of the reception coil, or due to the form, material, and the like of the housing of the electronic device, vary according to the magnitude of the received electric power, i.e., the magnitude of the current $I_{LOAD}$.

In order to solve such a problem, with such an arrangement, the current $I_{LOAD}$ is divided into multiple segments. Furthermore, the parameters $\alpha_1$ through $\alpha_N$ set for the respective segments are optimized so as to provide correct received electric power in a state in which the power receiving apparatus 300 is mounted on the electronic device. Such an arrangement allows the received electric power $P_{RP}$ received by the wireless power receiving apparatus 300 to be detected with high precision. Furthermore, by transmitting the received electric power $P_{RP}$ thus subjected to the correction processing to the power transmission apparatus 200, and by comparing the received electric power $P_{RP}$ with the transmitted electric power PTP transmitted by the power transmission apparatus 200, such an arrangement provides higher-precision abnormal object detection.

Also, by further employing the second parameter $\beta$, such an arrangement allows the received electric power $P_{RP}$ to be detected with even higher precision.

Description has been made above regarding an embodiment of the present invention with reference to the second embodiment. The above-described embodiment has been described for exemplary purposes only, and is by no means intended to be interpreted restrictively. Rather, it can be readily conceived by those skilled in this art that various modifications may be made by making various combinations of the aforementioned components or processes, which are also encompassed in the technical scope of the present invention. Description will be made below regarding such modifications.

Fifth Modification

Description has been made in the embodiment regarding an arrangement which is capable of allowing the parameters $\alpha_1$ through $\alpha_N$ and $\beta$ to be set via an external component. However, the present invention is not restricted to such an arrangement. For example, an arrangement may be made in which the current segment boundaries $I_1, I_2, \ldots, I_{N-1}$ are settable in addition to the parameters $\alpha_1$ through $\alpha_N$. That is to say, the parameter acquisition unit 404 is configured to acquire, via an external component, data configured as an instruction to set the threshold values $I_1$ through $I_{N-1}$ in addition to an instruction to set the parameters $\alpha_1$ through $\alpha_N$ and $\beta$.

With such a modification, the range of each of the multiple segments can be set based on the form, structure, and layout of the reception coil, or the form, material, and the like of the housing of the electronic device mounting the wireless power receiving apparatus. Thus, such a modification allows the received electric power to be calculated with even higher precision.

Sixth Modification

Description has been made in the embodiment regarding an arrangement in which the parameter $\beta$ that determines the interception is used as a common parameter to be used for all the segments, and the parameters $\alpha_1$ through $\alpha_N$ that each determine the slope are each settable for the corresponding segment. However, the present invention is not restricted to such an arrangement. For example, the parameter $\beta$ may be settable for each segment. Also, the received electric power $P_{RP}$ calculated by the correction using the parameters may be discontinuous at a boundary between adjacent segments.

Seventh Modification

Figure 8:
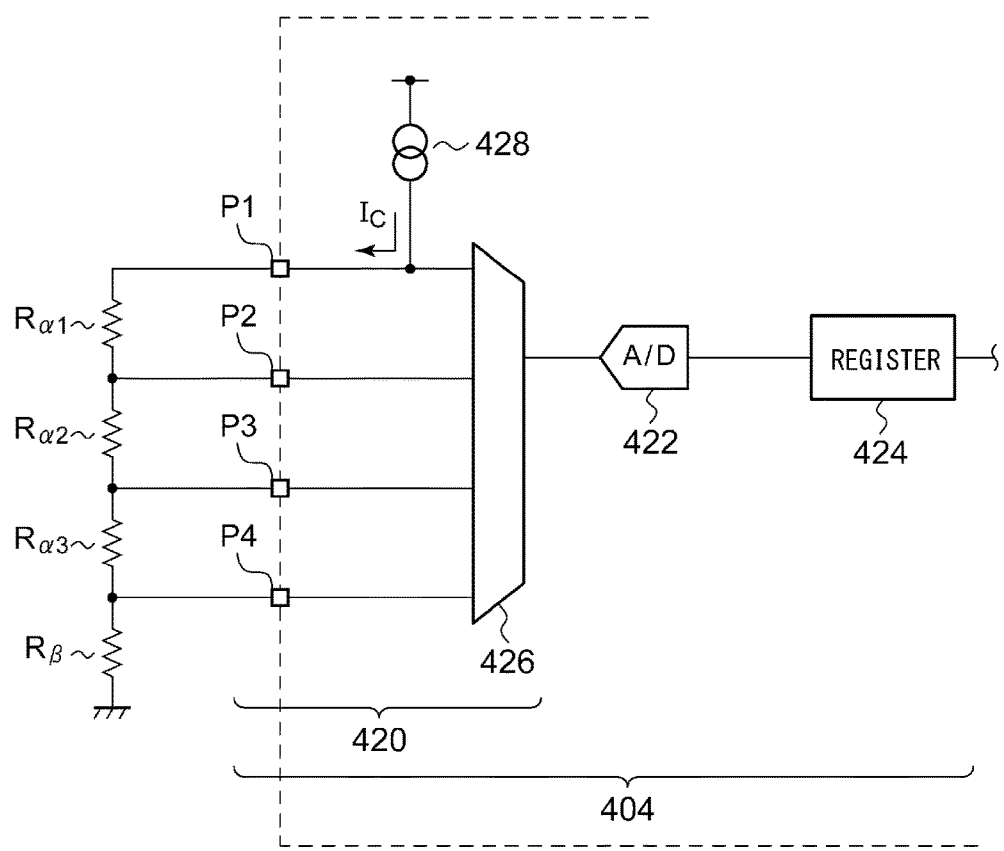
FIG. 8 is a circuit diagram showing another example configuration of a parameter acquisition unit.

Description has been made in the present embodiment regarding an arrangement in which, for the parameter acquisition unit 404, an instruction to set the parameters $\alpha$ and $\beta$ is made using a serial interface. However, the present invention is not restricted to such an arrangement. For example, an instruction to set the parameters $\alpha$ and $\beta$ may be made using external resistors. FIG. 8 is a circuit diagram showing another example configuration of the parameter acquisition unit 404.

The parameter acquisition unit 404 shown in FIG. 8 is coupled to multiple resistors $R_{\alpha 1}$ through $R_{\alpha N}$ and $R_\beta$. FIG. 8 shows an arrangement in which N=3. The parameter acquisition unit 404 is configured to acquire the first parameters $\alpha_1$ through $\alpha_N$ and the second parameter $\beta$ according to the respective resistance values of the multiple resistors thus connected.

The parameter acquisition unit 404 includes a voltage converter unit 420 and an A/D converter 422. The voltage converter unit 420 converts the resistance values of the multiple resistors $R_{\alpha 1}$ through $R_{\alpha N}$ and $R_\beta$ into respective multiple voltages $V_{\alpha 1}$ through $V_{\alpha N}$ and $V_\beta$. The A/D converter 422 converts the multiple voltages $V_{\alpha 1}$ through $V_{\alpha N}$ and $V_\beta$ into respective multiple digital values $D_{\alpha 1}$ through $D_{\alpha N}$ and $D_\beta$. Also, the selector 426 may be arranged as a stage preceding the A/D converter 422. With such an arrangement, the A/D converter 422 configured as a single A/D converter may convert the multiple voltages $V_{\alpha 1}$ through $V_{\alpha N}$ and $V_\beta$ into the digital values $D_{\alpha 1}$ through $D_{\alpha N}$ and $D_\beta$, respectively, in a time sharing manner. The digital values $D_{\alpha 1}$ through $D_{\alpha N}$ and $D_\beta$ are stored in the register 424 as the first parameters $\alpha_1$ through $\alpha_N$ and the second parameter $\beta$.

The voltage converter unit 420 includes multiple setting terminals P1 through P4 and a current source 428. The multiple resistors $R_{\alpha 1}$ through $R_{\alpha N}$ and $R_\beta$ are connected in series between the setting terminal P1 and an external ground terminal so as to form a resistor string. The multiple setting terminals P1 through P4 are connected to the terminals of the respective multiple resistors $R_{\alpha 1}$ through $R_{\alpha N}$ and $R_\beta$ (respective taps of the resistor string). The current source 428 is connected to the setting terminal P1, so as to supply a predetermined constant current Ic to the resistor string formed of $R_{\alpha 1}$ through $R_{\alpha N}$ and $R_\beta$.

The A/D converter 422 may convert, into a digital value, the voltage at each setting terminal, or at least one voltage difference between the setting terminals.

With such a configuration, by changing the resistance values of the resistors $R_{\alpha 1}$ through $R_{\alpha N}$ and $R_\beta$ each coupled as an external resistor on the control circuit 400, such an arrangement allows the value of each parameter to be set to a desired value.

The parameter acquisition unit 404a shown in FIG. 5 may be provided for each of the resistors $R_{\alpha 1}$ through $R_{\alpha N}$ and $R_\beta$. The resistor $R_\alpha$ is connected between the setting terminal P1 and the ground terminal. The resistor $R_\beta$ is connected between the setting terminal P2 and the ground terminal.

The parameter acquisition units 404a include multiple current converter units 430 and multiple voltage converter units 440.

The multiple current converter units 430 and the multiple voltage converter units 440 are provided to the respective multiple setting terminals P1 and P2. The current converter unit 430 generates a current $I_\alpha$ that is inversely proportional to the resistance value of the resistor $R_\alpha$ connected to the corresponding setting terminal P1. The voltage converter unit 440 converts the current $I_\alpha$ generated by the corresponding current converter unit 430 into a voltage $V_\alpha$ that is proportional to the current $I_\alpha$.

For example, the current converter unit 430 includes a transistor M1 and an operational amplifier OA1. The current $I_\alpha$, which is represented by $I_\alpha = V_{REF}/R_\alpha$, flows through the transistor M1 and the resistor $R_\alpha$. On the other hand, the voltage converter unit 440 includes a resistor R1 and a current mirror circuit comprising transistors M2 and M3. The voltage converter unit 440 converts the current $I_\alpha$ into a voltage $V_\alpha$ represented by $V_\alpha = K \times R1 \times I_\alpha$. Here, K represents the mirror ratio of the current mirror circuit. The same can be said of the setting terminal P2. The voltages $V_\alpha$ and $V_\beta$ are supplied to an unshown A/D converter, and are converted into digital values $\alpha$ and $\beta$, respectively.

Such a configuration allows the parameters $\alpha$ and $\beta$ to be set according to the resistance values of the external resistors.

Eighth Modification

Description has been made in the embodiment regarding an arrangement in which the received electric power $P_{RP}$ is calculated according to the following Expression.

$$P_D = f_D(I_{LOAD}) = V_{RECT} \times I_{LOAD} + R_{ON} \times I_{LOAD}^2 + V_{DD} \times I_{DD}$$

However, the present invention is not restricted to such an arrangement.

In a case in which the electric power consumption of the control circuit 400 is negligible, the term $V_{DD} \times I_{DD}$ may be omitted. Also, in a case in which the thermal loss is negligible, the term $R_{ON} \times I_{LOAD}^2$ may be omitted.

Alternatively, the received power calculation unit 402 may employ another function with a value that differs from the load current $I_{LOAD}$ as an argument.

Ninth Modification

Description has been made in the embodiment regarding a wireless power transmission apparatus that conforms to the Qi standard. However, the present invention is not restricted to such an arrangement. Also, the present invention is applicable to the power receiving apparatus 300 which is to be employed in a system that is similar to the Qi standard. Also, the present invention is applicable to the power receiving apparatus 300 that conforms to other standards which will be developed in the future.

Tenth Modification

A part of the modulator 308 or the power supply circuit 504 may be further integrated on the IC on which the control circuit 400 is integrated.

Eleventh Modification

The control circuit 400 described in the second embodiment and the modifications thereof can also be understood as follows.

The received electric power $P_{RP}$ shown in FIGS. 7A and 7B satisfies the following Expression.

$$P_{RPj} = \alpha \times f_D(I - I_{j-1}) = P_{RPj-1}(I_{j-1}) + \beta$$

Here, the relations $I_{RP0} = 0$ and $I_0 = 0$ hold true.

The control circuit 400 includes: a current detection unit (410) that detects the current I that flows through a predetermined path; a parameter acquisition unit (404) that acquires, via an external component, the parameters $\alpha_1$ through $\alpha_N$ specified for the respective segments each determined such that the range of the current I is divided into N (N represents an integer of 2 or more) segments; and a received power calculation unit (402, 406) that calculates the received electric power $P_{RPj}$ of the wireless power receiving apparatus in the j-th segment by means of a function that is set for each segment and that is determined using the parameters $\alpha_1$ through $\alpha_N$ and with the current I as an argument.

Figure 9:
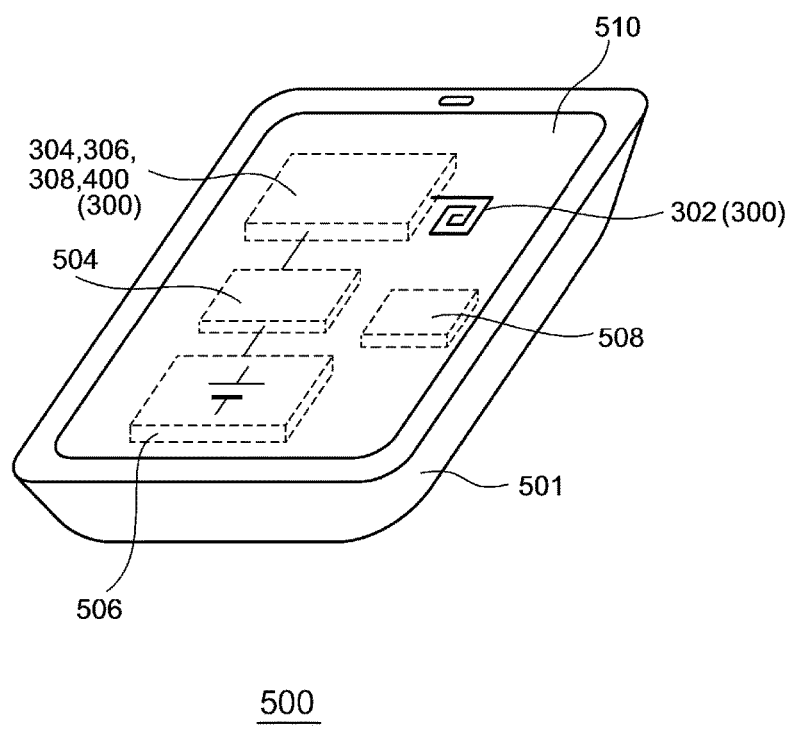
FIG. 9 is a diagram showing an electronic device including a power receiving apparatus.

Lastly, description will be made regarding a specific example of an electronic device. FIG. 9 is a diagram showing the electronic device 500 including the power receiving apparatus 300. The electronic device 500 shown in FIG. 9 is configured as a smartphone, tablet PC, portable game machine, portable audio player, or the like. A housing 501 includes, as built-in components, a power supply circuit 504, a secondary battery 506, a processor 508, a display apparatus 510, and the aforementioned power receiving apparatus 300. The processor 508 may include a wireless (RF) unit, a baseband processor, an application processor, an audio processor, and the like.

While the preferred embodiments of the present invention have been described using specific terms, such description is for illustrative purposes only, and it is to be understood that changes and variations may be made without departing from the spirit or scope of the appended claims.

What is claimed is:

1. A control circuit for a wireless power receiving apparatus, comprising:
    a current detection unit that detects a current I that flows through a predetermined path;
    a received power calculation unit that calculates an electric power consumption $P_D$ of the wireless power receiving apparatus based on a predetermined function $f_D(I)$ with the current I as an argument;
    a parameter acquisition unit that acquires parameters $\alpha_1$ through $\alpha_N$ to be respectively set for N (N represents an integer of 2 or more) segments obtained by dividing a range of the current I into N segments; and
    a correction unit that corrects the electric power consumption $P_D$ calculated by the received power calculation unit using the parameter $\alpha_i$ when the current I is included in the i-th ($1 \leq i \leq N$) segment.

2. The control circuit according to claim 1, wherein the j-th ($1 \leq j \leq N$) parameter $\alpha_j$ is used to correct a slope of the received electric power $P_{RPj}$ for the current I for the j-th segment.

3. The control circuit according to claim 2, wherein, with a threshold that determines a boundary between the i-th segment and the (i+1)-th segment as $I_i$, the correction unit calculates the received electric power $P_{RPi}$ for the j-th segment according to correction expressions that include:

$$P_{RP1} = \alpha_1 \times f_D(I);$$

$$P_{RP2} = \alpha_2 \times f_D(I - I_1) + \alpha_1 \times f_D(I_1);$$

$$P_{RP3} = \alpha_3 \times f_D(I - I_2) + \alpha_2 \times f_D(I - I_1) + \alpha_1 \times f_D(I_1);$$

and the like.

4. The control circuit according to claim 1, wherein, in addition to the parameters $\alpha_1$ through $\alpha_N$, the parameter acquisition unit is configured to acquire a parameter $\beta$ via an external component,
    and wherein the correction unit adds the parameter $\beta$ to the received electric power $P_{RP}$.

5. The control circuit according to claim 1, wherein, with a threshold that determines a boundary between the i-th segment and the (i+1)-th segment as $I_i$, the parameter acquisition unit is further configured to acquire, via an external component, parameters that indicate threshold values $I_1$ through $I_{N-1}$.

6. The control circuit according to claim 1, wherein the parameter acquisition unit comprises:
    an interface circuit that receives, via an external processor, serial data including an external parameter; and
    a register that stores the parameter thus received.

7. The control circuit according to claim 1, wherein the parameter acquisition unit is configured to be coupled to a plurality of resistors as external components,
    and wherein the parameter acquisition unit is configured to acquire the parameters $\alpha_1$ through $\alpha_N$ according to resistance values of the plurality of respective resistors thus connected.

8. The control circuit according to claim 1, wherein the current detection unit is configured to measure a current $I_{LOAD}$ that flows through a load of the wireless power receiving apparatus,
    and wherein the function $f_D(I)$ is defined with the current $I_{LOAD}$ as an argument.

9. The control circuit according to claim 8, wherein, in addition to the control circuit, the wireless power receiving apparatus further comprises:
    a reception coil;

a rectifier circuit that rectifies a current that flows through the reception coil; and a smoothing capacitor that is connected to an output of the rectifier circuit, so as to generate a rectified voltage $V_{RECT}$, and wherein the function $f_D(I_{LOAD})$ includes a term represented by $(V_{RECT} \times I_{LOAD})$.

10. The control circuit according to claim 9, wherein the function $f_D(I_{LOAD})$ further includes a term $(R_{ON} \times I_{LOAD}^2)$ with $R_{ON}$ as a predetermined constant.

11. The control circuit according to claim 9, wherein the control circuit comprises:

a power supply current measurement unit that measures an operation current $I_{DD}$ that flows through the control circuit; and a voltage measurement unit that measures a power supply voltage $V_{DD}$ supplied to the control circuit, and wherein the function $f_D(I_{LOAD})$ further includes a term $(V_{DD} \times I_{DD})$.

12. The control circuit according to claim 11, wherein the control circuit operates using the rectified voltage $V_{RECT}$ as the power supply voltage $V_{DD}$.

13. The control circuit according to claim 1, that conforms to the Qi standard.

14. The control circuit according to claim 1, monolithically integrated on a single semiconductor substrate.

15. A wireless power receiving apparatus comprising:

a reception coil;

a rectifier circuit that rectifies a current that flows through the reception coil;

a smoothing capacitor that is connected to an output of the rectifier circuit, so as to generate a rectified voltage $V_{RECT}$; and the control circuit according to claim 1.

16. An electronic device comprising:

a reception coil;

a rectifier circuit that rectifies a current that flows through the reception coil;

a smoothing capacitor that is connected to an output of the rectifier circuit, so as to generate a rectified voltage $V_{RECT}$; and the control circuit according to claim 1.

* * * * *